_United States Patent_ [19]

Fujita et al.

[11] Patent Number: 4,899,360

[45] Date of Patent: * Feb. 6, 1990

[54] SEMICONDUCTOR LASER DEVICE HAVING MONOLITHICALLY FORMED ACTIVE AND PASSIVE CAVITIES ON THE SAME SUBSTRATE

[75] Inventors: Toshihiro Fujita, Toyonaka; Jun Ohya, Neyagawa; Kenichi Matsuda, Moriguchi; Hiroyuki Serizawa, Hirakata, all of Japan

[73] Assignee: Matsushita Electric Industrial Co., Ltd., Osaka, Japan

[ * ] Notice: The portion of the term of this patent subsequent to Dec. 27, 2005 has been disclaimed.

[21] Appl. No.: 276,763

[22] Filed: Nov. 8, 1988

Related U.S. Application Data

[63] Continuation of Ser. No. 708,848, Mar. 5, 1985, Pat. No. 4,794,608.

[30] Foreign Application Priority Data

| Mar. 6, 1984 | [JP] | Japan | 59-43301 |
|---|---|---|---|
| Mar. 6, 1984 | [JP] | Japan | 59-43302 |
| Feb. 15, 1985 | [JP] | Japan | 60-28680 |
| Feb. 18, 1985 | [JP] | Japan | 60-29593 |
| Feb. 18, 1985 | [JP] | Japan | 60-29598 |
| Feb. 18, 1985 | [JP] | Japan | 60-29607 |
| Feb. 18, 1985 | [JP] | Japan | 60-29608 |

[51] Int. Cl.[4] .............................................. H01S 3/19
[52] U.S. Cl. ................................ 372/50; 455/610; 455/611
[58] Field of Search ............... 372/32, 45, 46, 49, 372/50, 92, 97, 26; 455/609, 610, 611

[56] References Cited

U.S. PATENT DOCUMENTS

| 4,488,307 | 12/1984 | Garmire et al. | 372/45 |
|---|---|---|---|
| 4,563,765 | 1/1986 | Tsang et al. | 372/50 |
| 4,608,697 | 8/1986 | Coldren | 372/50 |
| 4,653,058 | 3/1987 | Akiba et al. | 372/50 |
| 4,677,630 | 6/1987 | Fujita et al. | 372/32 |

OTHER PUBLICATIONS

Henry, Theory of the Linewidth of Semiconductor Lasers, IEEE Journal of Quantum Electronics, vol. QE-18, No. 2, Feb. 1982, pp. 259–264.

Akiba et al., Low-Threshold-Current Distributed-Feedback InGaAsP/InP CW Lasers, Electronics Letters, 21st Jan. 1982, vol. 18, No. 2, pp. 77–78.

High-Speed Direct Single-Frequency Modulation with Large Tuning Rate and Frequency Excursion in Cleave-Coupled-Cavity Semiconductor Lasers, Appl. Phys. Lett. 42 (8), 15 Apr. 1983, Tsang, Olsson, and Logan, pp. 650–652.

Choi et al., GaAs/GaAlAs Active-Passive-Interference Laser, Electronics Letters, 14th Apr. 1983, vol. 19, No. 8, pp. 302–303.

Kojima et al., "Long Cavity Ridge Waveguide AlGaAs/GaAs Distributed Feedback Lasers for Spectral Linewidth Reduction", Appl. Phys. Lett. 49 (7), Aug. 18, 1986, pp. 366–368.

Fujita et al., "Narrow Spectral Linewidth Characteristics of Monolithic Integrated-Passive Cavity InGaAsP-/InP Semiconductor Lasers", Electronics Letters, Apr. 25, 1985, vol. 21, No. 9, pp. 374–376.

(List continued on next page.)

Primary Examiner—James W. Davie
Attorney, Agent, or Firm—Wenderoth, Lind & Ponack

[57] ABSTRACT

A semiconductor laser device of a new monolithic structure has a long transparent optical waveguide used as a passive cavity directly coupled with an active cavity possessing a gain in the direction of the optical axis of the active cavity on a compound semiconductor substrate. The device is intended to satisfy all of four characteristics, which are;

(1) stable single longitudinal mode oscillation;
(2) narrow spectral linewidth;
(3) suppression of wavelength chirping due to current modulation; and
(4) low noise and to be applied as a light source for optical fiber communication, optical information processing or the like.

4 Claims, 11 Drawing Sheets

OTHER PUBLICATIONS

Matsuda et al., "Single Longitudinal Mode Operation of Long, Integrated Passive Cavity InGaAsP Lasers", Appl. Physics Lett. 46 (11), Jun. 1, 1985, pp. 1028–1030.

Lee, "Linewidth of Single-Frequency Semiconductor Lasers for Coherent Lightwave Communications", IOOC-ECOC '85, Conference in Venice, Italy, 1985, pp. 189–196.

Meissner et al., "Investigation of Linewidth and Side-Mode Suppression for a DBR Laser with Integrated Passive Waveguide", Electronics Letters, Mar. 13, 1986, vol. 22, No. 6, pp. 340–341.

Lee et al., "Linewidth and FM Characteristics of a Distributed Feedback Laser Monolithically Integrated with a Tunable External Cavity", Electronics Letters, Feb. 12, 1987, vol. 23, No. 4, pp. 153–154.

Piccirilli et al., "1.3 $\mu$m Integrated External Cavity Distributed Bragg Reflector Laser", J. Appl. Phys. 62 (1), Jul. 1, 1987, pp. 308–310.

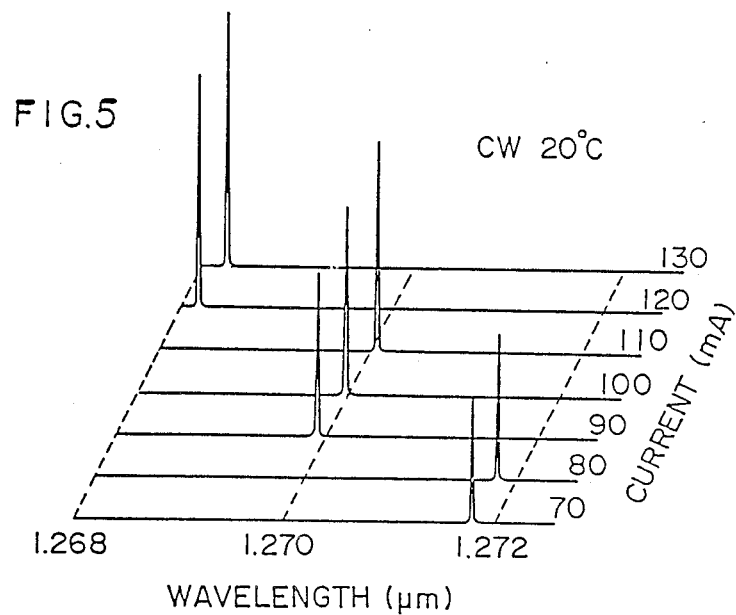
FIG.5
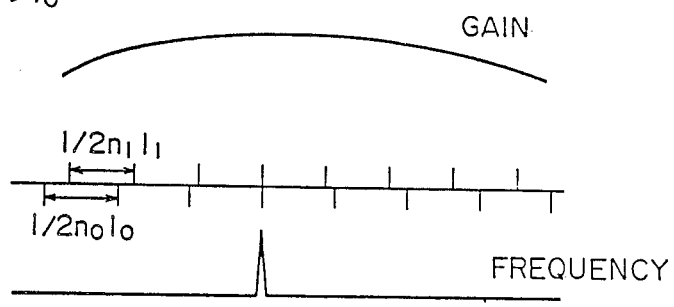
FIG. 6(a) $I_1 > I_0$
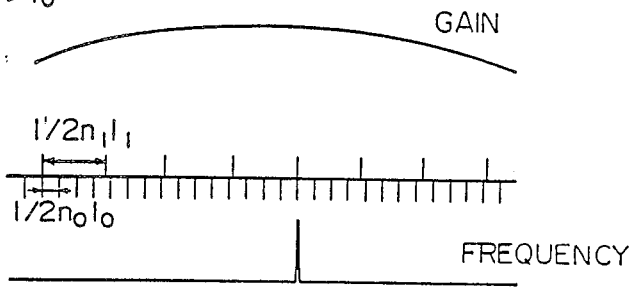
FIG. 6(b) $I_1 >> I_0$

SEMICONDUCTOR LASER DEVICE HAVING MONOLITHICALLY FORMED ACTIVE AND PASSIVE CAVITIES ON THE SAME SUBSTRATE

This is a continuation application of Ser. No. 06/708,848 filed Mar. 5, 1985, now Pat. No. 4,794,608.

BACKGROUND OF THE INVENTION

This invention relates to a semiconductor laser device having an active cavity possessing a gain and a passive optical waveguide integrated on the same substrate, and is intended to provide novel effects including stable single longitudinal mode oscillation, narrow spectral linewidth, a small amount of wavelength chirping due to current modulation, and no generation of intensity of noise against reflected light.

The recent progress of the semiconductor laser is striking, and it is widely used as the light sources for optical communication, optical information processing, optical fiber sensing, and so forth. At the present, however, the semiconductor laser involves the following four problems.

Firstly, the semiconductor laser does not oscillate in a single longitudinal mode. In an ordinary Fabry-Perot type semiconductor laser using cleaved facets as cavity mirrors, several longitudinal modes are likely to oscillate at the mode spacing determined by the cavity length (for example, 300 $\mu$m) due to the broad semiconductor gain width. That is, there is a disadvantage of occurrence of multimode oscillation.

Secondly, the spectral linewidth of the semiconductor laser is fairly broad. The spectral linewidth of a laser is usually defined by Shawlow-Townes' equation, but in the case of a semiconductor laser, in particular, it is shown that the linewidth is actually extended by $(1+\alpha^2)$ times the value described by this equation by, for example, C. H. Henry in "Theory of the linewidth of semiconductor lasers", IEEE J. Quantum Electronics, Vol. QE-18, No. 2, pp. 259-264 (1982). That is, in other words, there is a disadvantage of an extremely short coherent length.

Thirdly, the dynamic spectral linewidth is broad. For intensity modulation of a semiconductor laser, the injection current is modulated, which, however, results in fluctuations of carrier density and large variations of oscillation wavelength (oscillation frequency). This phenomenon is called wavelength chirping. For instance, when a semiconductor is used as a long-haul optical fiber communication source, the transmittable distance is significantly shortened if the amount of chirping is large, which is another disadvantage of the semiconductor laser.

Fourthly, an extremely large amount of noise is generated when a reflected light returns to the semiconductor laser from outside components. That is, when a semiconductor laser is coupled with an optical fiber or it is used as a source of optical information processing such as an optical disc, substantial reflected light returns to the semiconductor laser, noise increases, and the S/N ratio of the unit worsens, which is a great shortcoming for practice use.

Accordingly, solutions of these four problems are keenly demanded by users, and several methods have been proposed so far.

For example, a distributed feedback (DFB) laser is known, as presented by S. Akiba et al., "Low-threshold-current distributed-feedback InGaAsP/InP CW lasers," Electron. Lett., vol. 18, pp. 77-78 (1982). In the DFB laser, a sufficient characteristic is obtained as to the single longitudinal mode oscillation, but satisfactory results are not necessarily obtained with respect to spectral linewidth, oscillation frequency chirping and intensity of noise due to reflected light. That is, all four problems above are not solved completely. A cleaved-coupled-cavity ($C^3$) laser was proposed by W. T. Tsang et al., "High-speed direct single-frequency modulation with large tuning rate and frequency excursion in cleaved-coupled-cavity semiconductor lasers," Appl. Phys. Lett., vol. 42, pp. 650-652 (1983). This solution fabricate a coupled cavity laser by cleavage using two active cavities, but it involves problems in mechanical stability and reproducibility, and it is also reported that the characteristics are impaired when the reflected light is fed back. Again, the four problems are not solved completely. Another method was proposed by H. K. Choi and S. Wang, "GaAs/GaAlAs active-passive-interference laser," Electronics Letters, vol. 19, pp. 302-303 (1983). This semiconductor laser is formed by using an extremely short optical waveguide as a coupled cavity. The purpose of this laser lies solely in the unification of the longitudinal mode by mode selectivity of the cavity, and this method, which will be described in detail later, does not narrow the spectral linewidth or suppress wavelength chirping against current modulation. Further this solution does not refer to noise at all, and it is far from solving all of the above four problems.

In this background, the present inventors have invented, for the first time, a semiconductor laser of a novel structure that can solve all of such four problems, that is;

(1) stable single longitudinal mode oscillation
(2) narrow spectral linewidth
(3) suppression of wavelength chirping due to current modulation
(4) low noise all at once. This invention is based on patent application Ser. No. 671,469 entitled "Oscillation Frequency Stabilized Semiconductor Laser" (Filed November 14, 1984). U.S. application Ser. No. 671,469 does not teach a monolithic structure and its detail as a practical device. In this invention, a semiconductor laser of monolithic structure was actually fabricated, and its characteristics were evaluated experimentally, the results which are displayed here to show the effectiveness of the present invention. At the same time, the philosphy of the present inventors in solving the above four problems simultaneously, supporting evidence and possible examples of application are also explained.

SUMMARY OF THE INVENTION

It is a primary object of this invention to manufacture a semiconductor laser device of a new structure by monolithically forming an active cavity and a passive cavity on the same structure, and more specifically to obtain a semiconductor laser device unconventionally characterized by stable single longitudinal mode oscillation, narrow spectral linewidth, suppression of wavelength chirping due to current modulation, and low noise, by solving all of the four problems set forth above.

It is another object to prove that the desired characteristics may be presented stably and with excellent reproducibility, by showing that the optical path length of the active cavity, the optical path length of the passive cavity, the amplitude reflectivity of the facet of the active cavity close to the passive cavity, and the amplitude reflectivity of the facet of the passive cavity remote from the active cavity are greatly influential factors for the characteristics of a coupled cavity type semiconductor laser, and by exhibiting a practical structure of a device which can control these factors securely at desired values.

The semiconductor laser device of this invention comprises a compound semiconductor substrate, an active cavity possessing a gain partially formed on said substrate, and a passive cavity made of a transport optical waveguide formed on said substrate in contact with said active cavity in the direction of its optical axis wherein the ratio of the optical path length $L_0$ of said passive cavity to the optical path length $L_1$ of said active cavity is controlled within a range of $L_0/L_1 \geq 0.5$, and the amplitude reflectivity $r_1$ of the facet of said active cavity close to said passive cavity, the amplitude reflectivity $r_0$ of the facet of said passive cavity remote from said active cavity, and said $L_0/L_1$ are controlled at specified values.

In a first embodiment, the semiconductor laser device of this invention possesses a compound semiconductor substrate, an optical waveguide layer formed on said substrate, an active cavity partially formed on said optical waveguide layer and containing a separation layer with a larger band gap energy than said optical waveguide layer and an active layer with a smaller value, a striped load layer formed on said optical waveguide layer where said active cavity does not exist and made of the same compound semiconductor thin film as said separation layer, and a loaded guide type optical waveguide composed of said loaded layer and said optical waveguide layer.

In a second embodiment of the semiconductor laser device of this invention, the facet of the active cavity close to the passive cavity and the facet of the passive cavity close to the active cavity are not in contact with each other over the entire area of the optical coupling region, and a gap is provided by filling part of the whole of said optical coupling region with air or an insulator.

The semiconductor laser device of this invention is intended to be used as a light source for an analog transmission system, a long-haul digital transmission system, a local oscillator source and a signal source for a coherent type transmission system, a light source for current modulation at a modulation frequency of $C/2L_0$ (C: the velocity of light), a light source for optical information processing of an optical disc or the like, and other uses.

Dramatic improvements of system performance in the above mentioned applications are achieved by the present invention because of the excellent properties such as stable single longitudinal mode oscillation, narrow spectral linewidth, suppression of wavelength chirping due to current modulation, and low noise. While the novel features of the invention are set forth with particularity in the appended claims, the invention, both as to organization and contents, will be better understood and appreciated, along with other objects and features thereof from the following detailed description taken in conjunction with the accompanying drawings.

BRIEF DESCRIPTION OF THE DRAWINGS

FIG. 5 is a characteristic diagram showing the longitudinal mode performance of a semiconductor laser device according to the same embodiment;

FIGS. 6(a) and 6(b) are diagrams showing the principle of achievement of single longitudinal mode by a coupled cavity type semiconductor laser;

DETAILED DESCRIPTION OF THE INVENTION

Figure 1:
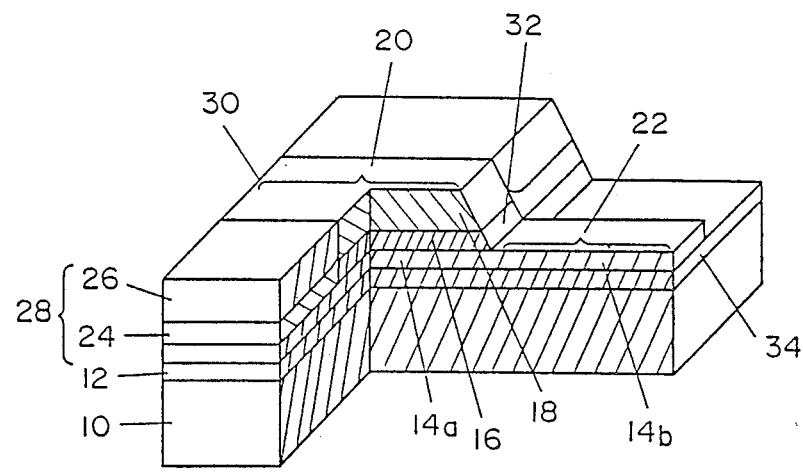
FIG. 1 is a perspective sectional view of essential parts of a semiconductor laser device according to one embodiment of the present invention.

Practical embodiments of the present invention are described below while referring to the accompanying drawings. FIG. 1 is a perspective view showing essential parts of one of the embodiments of this invention. In FIG. 1, an n-type InGaAsP waveguide layer 12 (with a band gap Eg=1.18 eV) is formed on an entire surface of an n-type InP substrate 10, and an active cavity 20 is composed by an n-type InP separation layer 14a, an n-type InGaAsP active layer 16 (Eg=0.95 eV), and a p-type InP clad layer 18 formed on a portion of waveguide layer 12. On the other hand, a load layer stripe 14b made of a same n-type InP as separation layer 14a is formed on the waveguide layer 12, while a passive cavity 22 is formed by this load layer 14b and waveguide layer 12 immediately beneath it. The active layer 16 is buried with a burying layer 28 composed of a p-type InP layer 24 and an n-type InP layer 26, but the waveguide layer 12 spreads over the entire surface of the substrate 10. The active cavity 20 is formed by two facets 30 and 32, while the passive cavity 22 is formed by two facets 32 and 34.

The passive cavity 22 in this embodiment is a so-called loaded waveguide, and although the waveguide layer 12 itself spreads laterally, it is actually a three-dimensional waveguide in which the guided light is confined transversely due to the load layer stripe 14b thereabove. In this embodiment, the stimulated light emission is generated in the active layer 16 in the active cavity 20 and then the light is guided to the waveguide layer 12 of the passive cavity 22. The light is reflected by the facet 34 of the passive cavity 22 back to the active cavity 20. In this embodiment, a waveguide can be set up even in an other than the extension of the active layer 16 of the active cavity 20 only by forming a load layer stripe 14b.

Figure 2A:
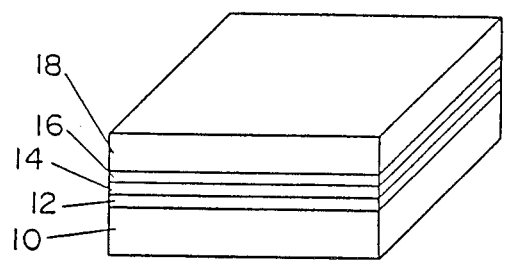
FIGS. 2(a)–2(c) are perspective views showing the manufacturing method of a semiconductor laser device according to the same embodiment.
Figure 2B:
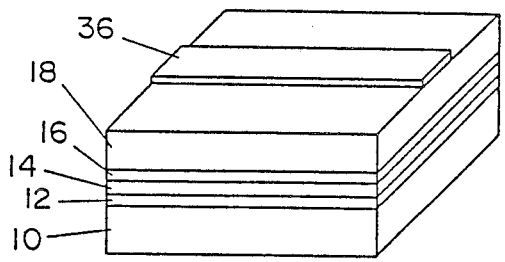
Figure 2C:
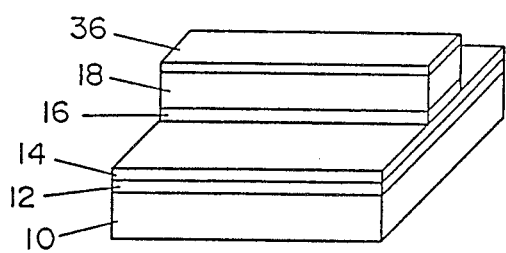

The manufacturing method of this embodiment is explained below by referring to drawings. FIGS. 2(a)–2(c) are perspective views showing the structure after each manufacturing process of this embodiment. As shown in FIG. 2(a), an n-type InGaAsP waveguide layer 12 (Eg=1.18 ev), an n-type InP separation layer 14, an n-type InGaAsP active layer 16 (Eg=0.95 eV), and p-type InP clad layer 18 are sequentially formed on an n-type InP substrate 10 by epitaxial growth. Next, an insulator film such as SiO is laid on the clad type 18 by CVD process or other method, and the pattern thereof is formed by photolithography, such that an insulator film stripe 36 as shown in FIG. 2(b) results. Using this insulator film 36 as an etching mask, the clad layer 18 is etched by a selective etchant for InP, for example, a solution of $HCl:H_3PO_4=1:4$ (in volume), and is further etched by a selective etchant for InGaAsP, for example, a solution of $H_2SO_4:H_2O_2:H_2O=1:1:5$ (in volume), so that a structure as shown in FIG. 2(c) is obtained.

Afterwards, leaving the insulator film 36, when a p-type InP layer 24 and an n-type InP layer 26 are grown sequentially by epitaxial growth, a buried structure as shown in FIG. 1 is obtained. After once removing the insulator film stripe 36, another insulator film is laid, and an insulator film band is formed by photolithography. Using this insulator film as mask, etching is done by a selective etchant for InP to obtain a structure having a crystalline plane exposed to the surface and composed only of the active layer 16 of InGaAsP and waveguide layer 12 of InGaAsP, and this is not etched by the selective etchant for InP, so that etching automatically stops when a structure similar to 22 in FIG. 1 is formed. Finally, when the other insulator film is removed by etching the active layer 16 by an etchant which etches InGaAsP of Eg=0.95 eV but hardly does InGaAsP of Eg=1.18 eV, for example, a solution of $H_2SO_4:H_2O_2:H_2O=1:1:5$, the structure of the embodiment shown in FIG. 1 is completed.

To cause this embodiment to function actually as a laser device, subsequent processes of evaporating contact metal and other processes are necessary, of which explanations are, however, omitted because these processes can be easily effected in the conventional manner. In the above description, meanwhile, up to the active layer 16 was etched in the process in FIG. 2(c), but it is the same when up to the separation layer 14 was etched afterwards by using a selective etchant of InP, followed by the burying process to obtain the structure 28 shown in FIG. 1. Only a single device is shown on the substrate, but the nature of the invention is not changed if multiple devices are simultaneously formed on the substrate, as in an ordinary IC manufacturing process and are later separated into individual devices.

In the manufacturing method of the above embodiment, since all etching operations are done by selective etchants, the controllability of etching is improved, and the buried active layer and loaded waveguide are matched by self-alignment, so that the optical coupling efficiency of the two is successively enhanced.

Figure 3:
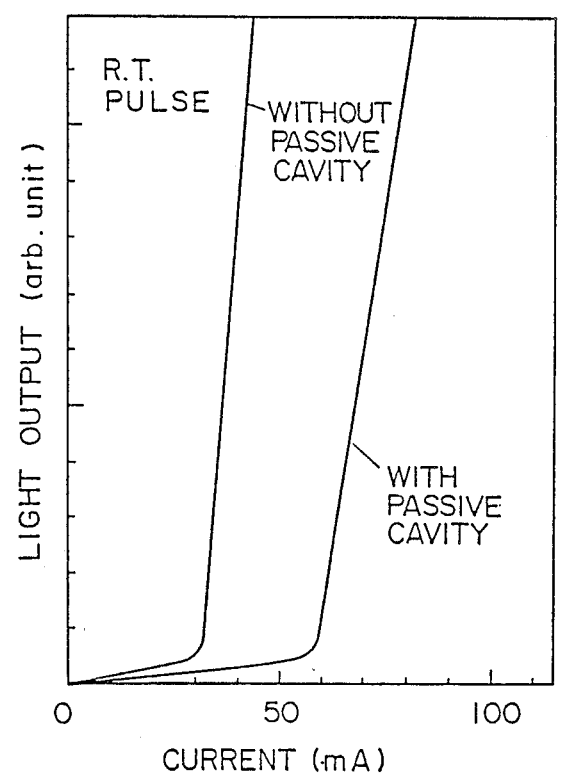
FIG. 3 is a characteristic diagram showing the current-optical output performance of a semiconductor laser device according to the same embodiment.

The following measured results were obtained by fabricating a semiconductor laser device of this embodiment according to the above manufacturing method. The current-light output power characteristics at room temperature pulse operation of the fabricated device are shown in FIG. 3, which also shows, by way of comparison, the characteristics of a device comprising only an active cavity. The illustrated device will passive cavity has a passive cavity length $l_0=3553$ μm and an active cavity length of $l_1=400$ μm, while the length of the device comprising only an active cavity is 248 μm. Since the oscillation threshold current of the former was 58 mA and that of the latter was 31 mA, it is estimated, as stated above, that the optical coupling efficiency of the active cavity and the passive cavity width be high.

Figure 4:
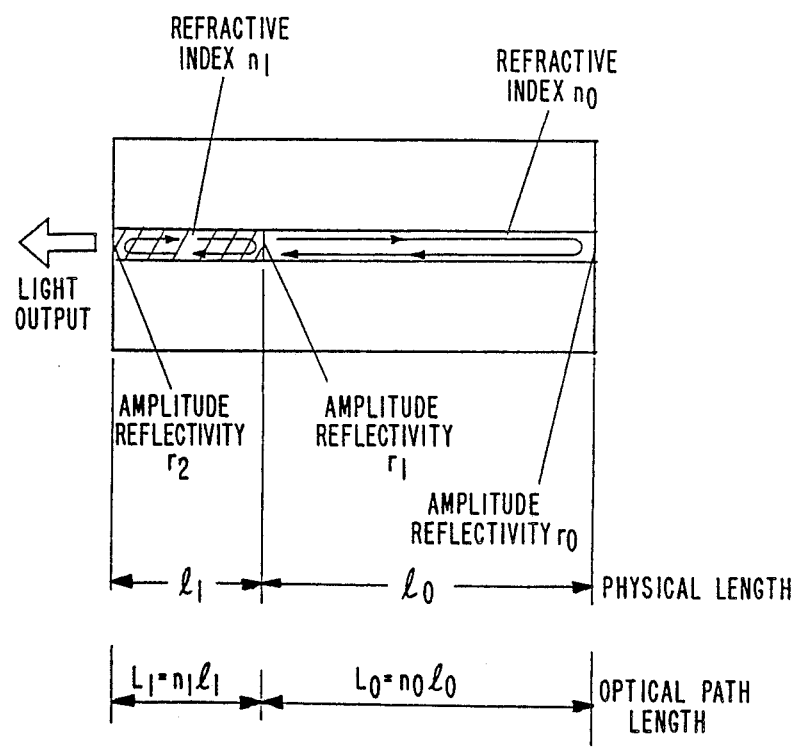
FIG. 4 is a view diagrammatically illustrating parameters defined in the present invention, such as amplitude reflectivities, cavity lengths, and refractive indicies.

Below are discussed the characteristics of the device of this embodiment, that is, the aforesaid longitudinal mode spectra, spectral linewidth, wavelength chirping, and noise characteristics in relation to the active cavity length $l_1$, passive cavity length $l_0$, amplitude reflectivity $r_0$ of the facet of the passive cavity, and amplitude reflectivity $r_1$ of the facet of the active cavity close the the passive cavity. In order to illustrate the desired parameters such as amplitude reflectivities and cavity lengths, a simple schematic drawing is shown in FIG. 4. The optical path lengths $L_1$, $L_0$ of the active and passive cavities correspond to $l_1$, $l_0$ in the relation of $L_1=n_1l_1$, $L_0=n_0l_0$ where $n_1$, $n_0$ are refractive indices of the active and passive cavities. In this embodiment, $l_1$, $l_0$ can be easily adjusted by making a cleavage after fabrication of the device. Yet, $r_0$, $r_1$ are variable by coating the passive cavity facet 34 or the facet 32 of the active cavity close to the passive cavity with reflection coatings: For example, when Au was deposited on the passive cavity facet 34 to form a reflection coating in a device with threshold current of 58 mA mentioned above, the threshold current was lowered by 10 mA. Thus, $r_0$ was increased by about three times, which suggests that $r_0$ is variable.

The device of this embodiment exhibits a stable single longitudinal mode oscillation from immediately above the threshold current. FIG. 5 shows the longitudinal mode characteristics at 20° C., CW operation of the above device with $l_0=3553$ μm and $l_1=400$ μm. The main to sub mode suppression ratio of this device was a maximum of 30 dB or more. On the other hand, multiple longitudinal mode oscillation occurred in the device comprising only an active cavity. It is known that the addition of the passive cavity is extremely effective for unifying the longitudinal mode. The reason for unification of the longitudinal mode lies in the effect of mode selectivity by the coupled cavities. The oscillation wavelength of a semiconductor laser mentioned above is about 1.3 μm, and its gain width is about 200 Å or so. Therefore, in the case of a conventional laser without a passive cavity, supposing the optical path length of the semiconductor laser to be $L_1=1$ mm, the wavelength spacing of the longitudinal mode $\Delta\lambda\cong\lambda^2/2L_1$ is about 8.5 Å, which means multiple longitudinal modes are present within the gain. By contrast, when a passive cavity is added, since a phase condition of wavelength spacing $\Delta\lambda\cong\lambda^2/2L_0$ is newly added to the optical path length $L_0$ of the passive cavity, only the mode that satisfies the phase condition of two cavities can be oscillated. This relation is shown in the drawings, wherein since $L_0=n_0l_0$, $L_1=n_1l_1$, if $l_1>l_0$, it becomes as shown in FIG. 6(a), and if $l_1 < < l_0$, it becomes as shown in FIG. 6(b). Therefore, from the viewpoint of selectivity of the longitudinal mode, it was conventionally considered that the relation of $l_1 > l_0$ was preferable, and this relation of $l_1 > l_0$ was believed to be essential for unification of the longitudinal mode in the conventional coupled cavity laser. However, since a single longitudinal mode oscillation can be obtained in the aforesaid device with $l_0 = 3553$ μm and $l_1 = 400$ μm, it is found that the longitudinal modes can be unified even if $l_1 > > l_0$. This is an important fact that has been first disclosed by the device of the present inventors.

Incidentally, the following results were obtained by measuring the oscillation spectral linewidth of the device of this embodiment. The spectral linewidth was measured by the delayed self-heterodyne technique using 5 km length optical fiber delay and 120 MHz acoustic-optic frequency shifter. The spectral linewidth of the full width at half maximum is determined as half the beat spectrum recorded on a spectrum analyzer. The device used in such measurement had $l_0 = 1518$ μm and $l_1 = 265$ μm. In this device, as a result of measurement of the spectral linewidth before and after applying a reflection coating of Au to the passive cavity facet, the minimum spectral linewidth was respectively 10 MHz and 0.9 MHz. That is, it is observed that increasing $r_0$ is important for narrowing the spectral linewidth. More generally, the spectral linewidth can be narrowed by increasing $l_0/l_1$ and $r_0/r_1$. This is because the active cavity involves many causes of fluctuation of the refractive index even during dc driving, while the passive cavity is stable and the oscillation wavelength is stabilized as the length of the passive cavity increases. Moreover, when the total cavity length $(l_0+l_1)$ becomes longer, the photon lifetime of the semiconductor laser cavity becomes longer, which is effective to narrow the spectral linewidth. When using a semiconductor laser, for example, in coherent communication, it is essential to keep the spectral linewidth below 1 MHz, and it was extremely difficult to obtain this value in a conventional semiconductor laser, whereas it is an extremely notable fact that a value of 0.9 MHz could be easily obtained in this embodiment. This for the first time was made possible by the present invention.

Figure 7:
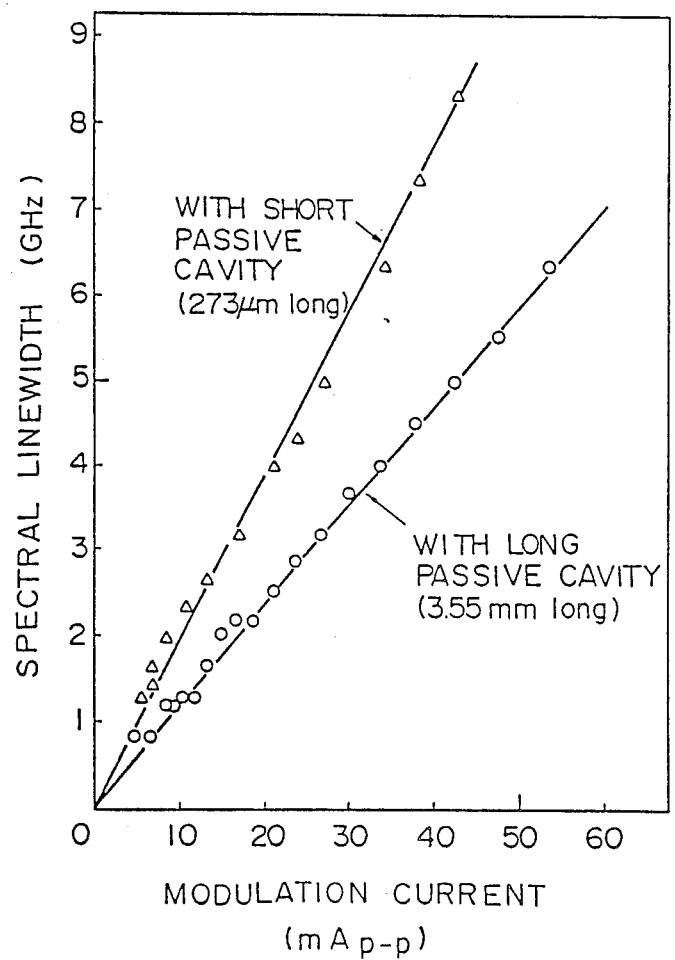
FIG. 7 is a characteristic diagram showing the amount of wavelength chirping of a semiconductor laser device according to the same embodiment.

Referring now to the results of measurement of wavelength chirping, FIG. 7 shows the amount of chirping measured in a device with $l_0 = 273$ μm and $l_1 = 224$ μm, and a device with $l_0 = 3553$ μm and $l_1 = 400$ μm. In this measurement, a piezo-scanning Fabry-Perot interferometer was used, and the full width at half maximum of the spectrum was obtained by 100 MHz sinusodial current modulation. From this diagram it is evident that the suppression of chirping is more effective when $l_0/l_1$ is greater. Hereunder the causes of chirping and the analytical results of its suppression are described.

The optical path length $L_1$ of a semiconductor laser is expressed in the form of $L_1 = n_1 l_1$ with the refractive index $n_1$ of the active layer and the actual physical length $l_1$. The semiconductor laser is an element which is driven by an electric current, but the refractive index $n_1$ of the active layer varies very sensitively with variation $\Delta I$ of the driving current I, thereby causing a refractive index variation $\Delta n$. The reason for the cause of $\Delta n$ greatly depends on the rate of variation of $\Delta I$, that is, the modulation frequency, and it is due to the change in the carrier density at higher frequency ($\geq 50$ MHz) and is due to the temperature change at low frequency ($<50$ MHz). When $\Delta n$ occurs, the cavity length $L_1$ is substantially elongated, and the oscillation wavelength of the semiconductor layer varies accordingly.

The same pheonomenon also occurs when the ambient temperature changes. That is, the oscillation wavelength of a semiconductor laser is extremely likely to change.

The description hitherto refers to an ordinary semiconductor laser, and the characteristics of a semiconductor laser of this invention having a transparent optical waveguide integrated to the semiconductor are described below. The change of oscillation mode in a coupled cavity laser is derived from the change $\Delta n$ of the refractive index of the active cavity. In the explanation to follow, the oscillation frequency of the oscillation longitudinal mode of the semiconductor is expressed as $\nu_0$, and the amount of shift of the oscillation frequency of the laser when the refractive index change $\Delta n$ occurs is indicated by $\Delta \nu_1$ in the absence of a passive cavity and $\Delta \nu_2$ in the presence thereof. By the coupled cavity structure, basically, the oscillation frequency shift of the laser by $\Delta n$ can be decreased. That is, it can be expressed as $\Delta \nu_2 \leq \Delta \nu_1$, and supposing $\Delta \nu_1/\Delta \nu_2 = x$, $\Delta \nu_2/\Delta \nu_0 = y$, $y/z = \Delta \nu_2/\Delta \nu_1$ is herein termed the degree of suppression of shift of the oscillation frequency of the semiconductor laser with respect to the refractive index change $\Delta n$. The smaller $\Delta \nu_2/\Delta \nu_1$, the more is suppressed the oscillation frequency shift, that is, chirping of the oscillation wavelength is lessened. The value of this $\Delta \nu_2/\Delta \nu_1$ greatly depends on the ratio $L_0/L_1$ of optical path length $L_1$ of the active cavity to optical path $L_0$ of the passive cavity, amplitude reflectivity $r_0$ at the facet of the passive cavity, and amplitude reflectivity $r_1$ at the facet of the active cavity at the coupling junction of the active cavity and the passive cavity, which is described below.

Figure 8:
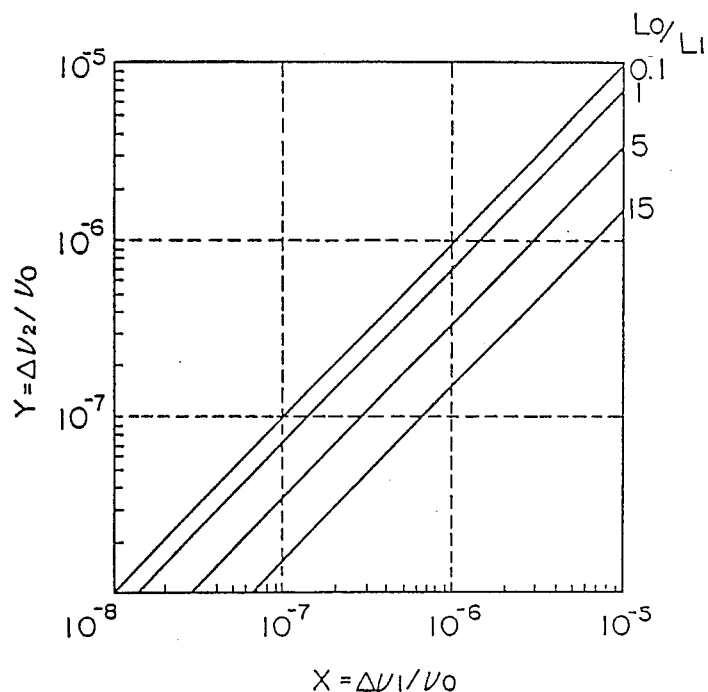
FIG. 8 is a diagram demonstrating that the amount of oscillation frequency shift depends on the ratio of optical path length of active cavity to optical path length of passive cavity $L_0/L_1$.

FIG. 8 shows the relation of y to x at $r_1 = 0.4$ ($r_1^2 = 0.16$), $r_0 = 0.5$ ($r_0^2 = 0.25$) in terms of $L_0/L_1$. This condition of $r_1 = 0.4$ is based on the assumption of coating the active cavity facet with a reflection coating. Also, $r_0 = 0.5$ was a result of estimating a loss at the coupling region, assuming a cleaved facet at the waveguide. When $\lambda = 1.3$ μm, $\nu_0 = 2.3 \times 10^{14}$ [Hz], and $x = 10^{-6}$ on the axis of the abscissas in FIG. 8 is found to occur when $\Delta \nu_1 = 2.3 \times 10^8$ [Hz] is without a passive cavity according to $\Delta n$. At this time, when a passive cavity with an optical path length of $L_0$ is coupled, the value of $y = \Delta \nu_2/\Delta \nu_0$ on the axis of the ordinate is obviously lowered depending on the parameter of $L_0/L_1$. That is, the oscillation frequency shift is suppressed, but it must be noted it depends greatly on the value of $L_0/L_1$.

Figure 9:
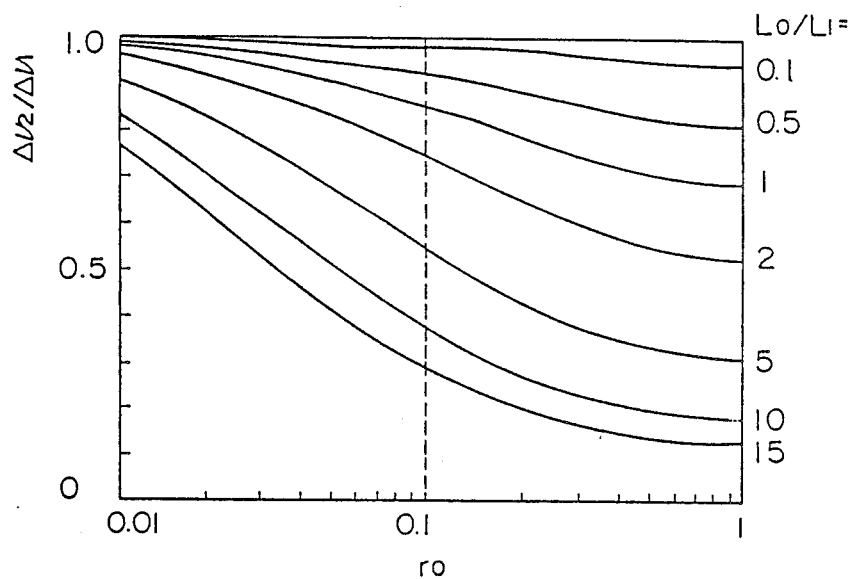
FIGS. 9 and 10 are diagrams showing that the amount of oscillation frequency shift depends not only on the $L_0/L_1$ ratio, but also greatly on the amplitude reflectivity $r_0$ of the facet of passive cavity remote from active cavity and the amplitude reflectivity $r_1$ of the facet of active cavity close to passive cavity.

FIG. 9 shows the dependence of the degree of suppression of the oscillation frequency shift $\Delta \nu_2/\Delta \nu_1$ due to a refractive index change $\Delta n$ of the active layer on the amplitude reflectivity $r_0$ at the facet of the passive cavity at $r_1 = 0.4$ in terms of $L_0/L_1$. As is clear from this diagram, the degree suppression of the oscillation frequency shift depends not only on $L_0/L_1$, but also greatly on the amplitude reflectivity $r_0$ at the facet of the passive cavity. That is, as shown in one of the embodiments of this invention, the oscillation characteristics can be determined only when the passive cavity facet is coated with a reflection coating or an antireflection coating.

Referring next to the effects of amplitude reflectivity $r_1$ of the active cavity facet in the coupling region of the active cavity and the passive cavity on the semiconductor laser characteristics of coupled cavity structure, as shown in one of the embodiments of this invention, $r_1$ can be set arbitrarily by coating the facet of the active cavity at the side of the passive cavity with reflection coating.

Figure 10:
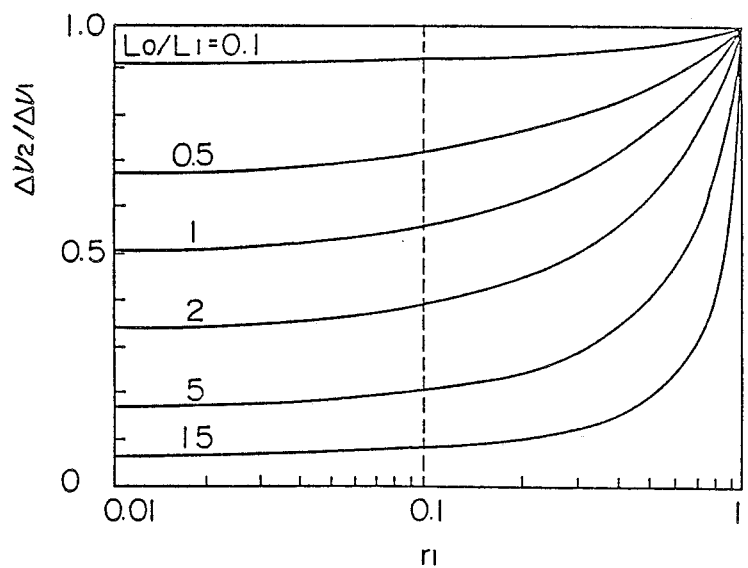

FIG. 10 shows the dependence of the degree of suppression $\Delta v_2/\Delta v_1$ of shift of the oscillation frequency due to refractive index change $\Delta n$ of the active layer on the amplitude reflectivity $r_1$ at the facet of the active cavity close to the passive cavity at $r_0=0.5$ in terms of $L_0/L_1$. As is clear from this diagram, the degree of suppression $\Delta v_2/\Delta v_1$ of shift of the oscillation frequency depends also greatly on $r_1$, and $\Delta v_2/\Delta v_1$ can be lowered when $r_1$ is reduced. That is, the desired oscillation characteristics cannot be obtained stably unless the amplitude reflectivity of the active cavity is controlled by the method of the embodiments of the present invention.

As described so far, the degree of suppression of shift of the oscillation frequency, that is the degree of suppression of wavelength chirping, depends greatly on $L_0/L_1$, $r_0$, $r_1$. This result agrees with the experimental fact of greater suppression of wavelength chirping at greater $l_0/l_1$ ratio as discussed above, which means, in other words, that the wavelength chirping may be suppressed at an arbitary degree of properly selecting the values of $L_0/L_1$, $r_0$, $r_1$. In the device of this embodiment, as mentioned above, $L_0/L_1$, $r_0$, $r_1$ are variable, which is a notable advantage not found in the existing devices.

As a result of further experiments and analyses by the present inventors, it has been confirmed that the relation of $L_0/L_1 > 0.5$ is extremely effective for improvement of the characteristics. Accordingly, the range of $L_0/L_1 \geq 0.5$ is included as one of the features of this invention.

Figure 11:
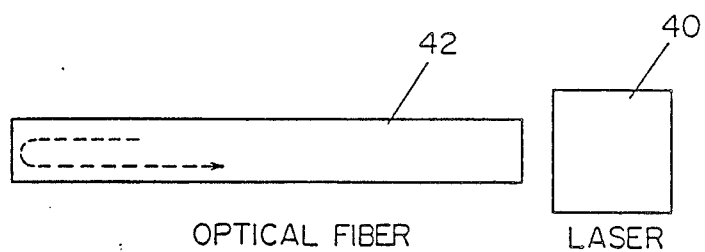
FIG. 11 is a schematic drawing showing a semiconductor laser coupled with an optical fiber.
Figure 12A:
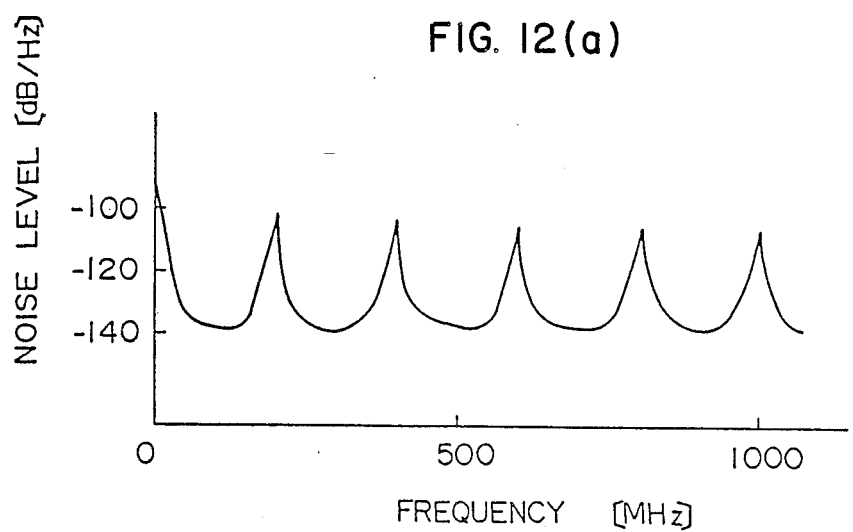
FIGS. 12(a) and 12(b) are diagrams showing intensity noise spectra of semiconductor lasers, wherein FIG. 12(a) refers to a conventional semiconductor laser comprising only an active cavity and FIG. 12(b) denotes a semiconductor laser of this invention.
Figure 12B:
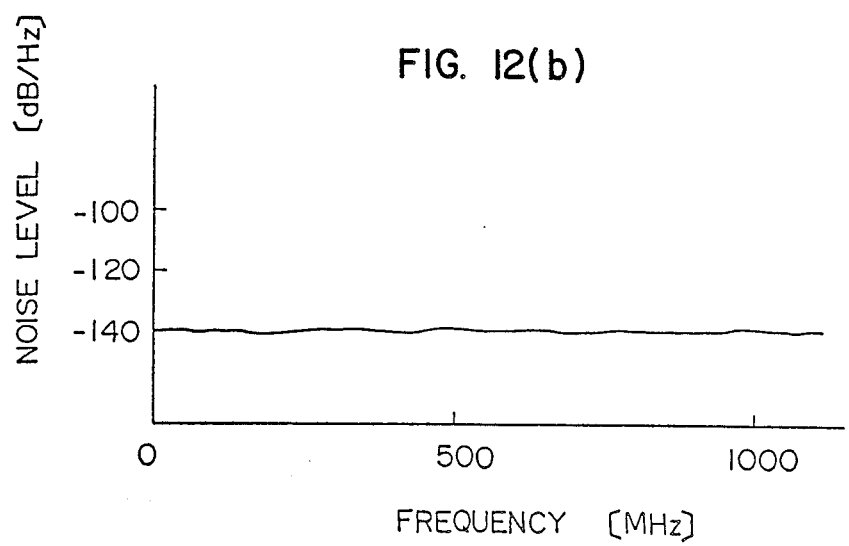

Finally, the noise characteristics of this embodiment are discussed. Usually, when a reflected light returns to a semiconductor laser from outside components, the operation characteristics become extremely unstable, and the intensity of noise drastically increases. For example, when a semiconductor laser is coupled with an optical fiber, the noise level is increased by the reflected light from the optical fiber facet. Or when used as an optical disk source, for example, the noise level is increased by the reflected light from the disk surface. By contrast, in the semiconductor laser of this invention, such intensity of noise due to reflected light does not occur. As one example of this characteristic, coupling of a semiconductor laser 40 with an optical fiber 42 is shown in FIG. 11. The noise characteristics of a semiconductor comprising only an active cavity and of the semiconductor laser according to this invention are shown in FIGS. 12(a) and 12(b), respectively. In the case of the ordinary semiconductor laser, the resonance like noise peaks corresponding to the length of the optical fiber are found to be much as 40 dB as shown in FIG. 12 (a). This noise level increases also at the low frequency side around DC. To the contrary, in the case of this invention, no noise occurs as shown in FIG. 12 (b). In both cases, light of a similar amount is reflected from the optical fiber, but there is a difference of 40 dB in the noise level. This difference is extremely significant in practical use, and noise suppression is realized only with this invention, and its effect is dramatic.

Figure 13:
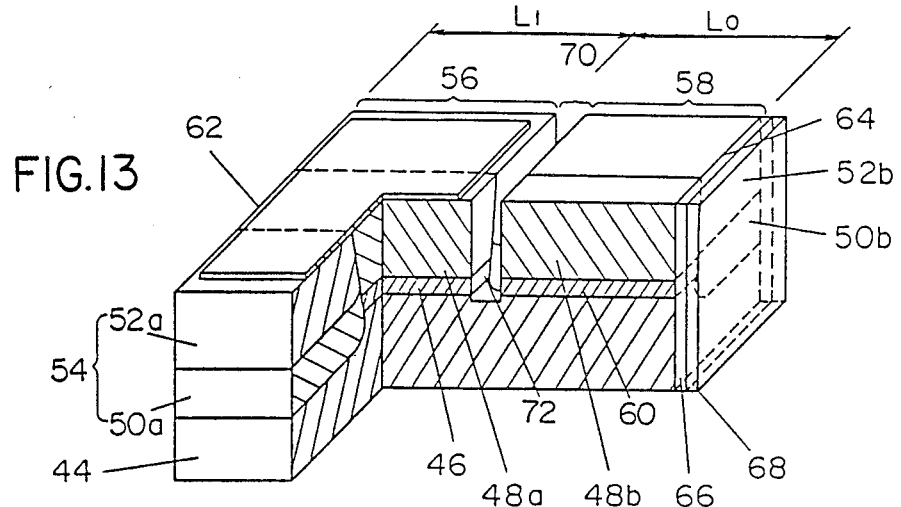
FIG. 13 to FIG. 17 are sectional views of a semiconductor laser device according to a different embodiment of this invention.

Now, a second embodiment of this invention is explained below in conjunction with the appended drawings. FIG. 13 is a perspective view of essential parts of a second embodiment of this invention, in which an n-type InGaAsP active layer 46 (with a band gap $Eg=0.96$ eV) and a p-type InP clad layer 48 on an n-type InP substrate 44 are buried by a burying layer 54 composed of a p-type InP layer 50a and an n-type InP layer 52a, whereby an active cavity 56 is formed. On the other hand, a passive cavity 58 is similar in structure to the active cavity 56 except that the portion corresponding to the active layer 46 of the active cavity 56 is an n-type InGaAsP waveguide layer 60 ($Eg=1.18$ eV), and passive cavity 58 is composed of waveguide layer 60, p-type clad 48b, p-type InP layer 50b and n-type InP layer 52b.

Figure 14A:
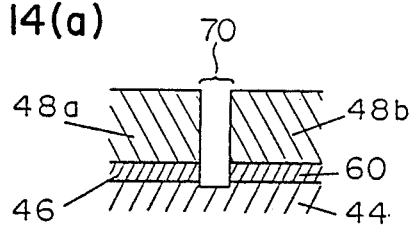
Figure 14D:
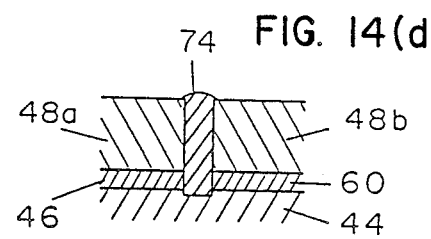
Figure 14B:
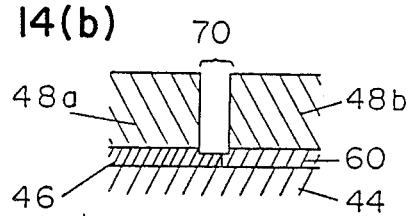
Figure 14E:
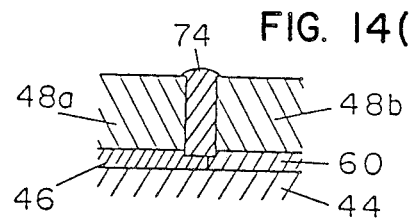
Figure 14C:
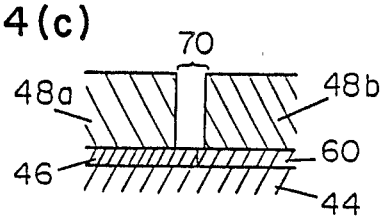
Figure 14F:
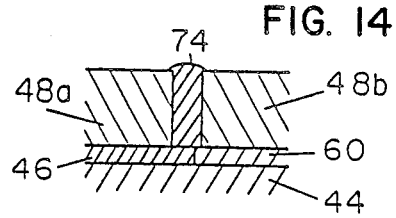

In this embodiment, by cleaving the active cavity facet 62 and passive cavity facet 64 after fabrication of the element, the ratio $L_0/L_1$ of the optical path length $L_0$ of passive cavity 58 to the optical path length $L_1$ of active cavity 56 can be easily set to a desired value. Besides, by coating the passive cavity facet 64 with a reflection coating composed of an insulator film 66 of $SiO_2$, $Si_3N_4$, $Al_2O_3$ or the like and a metal film 68 of Au or the like, the amplitude reflectivity $r_0$ of the passive cavity facet 64 can be increased. Or when coated with an antireflection coating comprising only an insulator film, $r_0$ decreases, so that the value of $r_0$ may be arbitrary changed. Furthermore, a gap 70 is provided between the active cavity 56 and passive cavity 58, so that the facet 72 of the active cavity 56 may possess an amplitude reflectivity $r_1$. The optical path length of this gap is sufficiently short in comparison with the oscillation wavelength of the semiconductor laser, that its effect as an optical etalon can be ignored. A sectional view of only the portion of this gap 70 is shown in FIG. 14(a), and $r_1$ can be varied by changing the shape of this gap as shown in FIGS. 14(b) to 14(f). That is, the depth of the groove to form the gap is varied in FIG. 14(b) 14(c) and the groove is filled with an insulator 74 in FIGS. 14(d) to 14(f). As the insulator 74, for example, $SiO_2$, $Si_3N_4$, $Al_2O_3$, polyimide, and semi-insulating InP may be used.

In this embodiment, not only the active layer 46 but also the waveguide layer 60 are in buried structure, and the light oscillated in a single transverse mode in the active cavity 56 propagates up to the waveguide 58 in the same single transverse mode.

Figure 15:
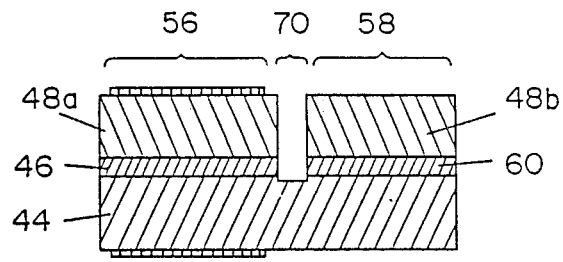

A third embodiment of the invention is shown in the sectional view of FIG. 15. In this embodiment, an active layer 46 and a waveguide layer 60 are formed by identical thin films with a multiple quantum well structure of InP and InGaAsP. The stimulated emission from a semiconductor laser possessing the active layer of a multiple quantum well structure is hardly absorbed in the waveguide layer having the same structure as the active layer. Therefore, in this embodiment, the purpose of this invention can be achieved if the active layer 46 and waveguide layer 60 share the same multiple quantum well structure.

Figure 16:
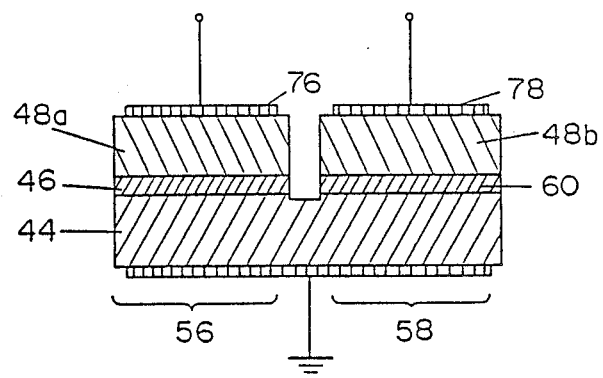

A fourth embodiment of the invention is shown in the sectional view of FIG. 16. The basic composition of this embodiment is same as that of the second embodiment, except that an electrode 78 to control the effective refractive index of wageguide layer 60 is provided. To change the effective refractive index of the waveguide layer 58, for example, the pockels effect may be used by applying a reverse bias to the electrode, or the plasma oscillation effect may be utilized by injecting an electric current.

That is, the possibility of suppression of shift of the oscillation frequency of a semiconductor laser by the present invention is as described in the first embodiment, and it is further possible to eliminate change of the oscillation frequency by varying the refractive index of the passive cavity.

Figure 17:
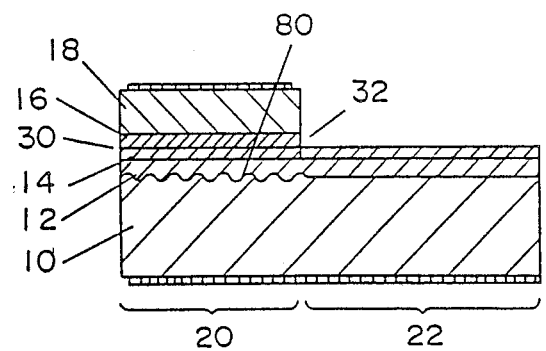

A fifth embodiment of the invention is shown in the sectional view of FIG. 17, wherein the reference numbers employed are identical with those in the first embodiment shown in FIG. 1. What differs from the first embodiment is that a grating (corrugation) 80 is formed on the substrate in the active cavity 20, and that the active cavity 20 is a so-called distributed feedback (DFB) type semiconductor laser. The DFB laser, if alone, is known to be enhanced in the unification of the oscillation mode as compared with the usual Fabry-Perot laser, and the characteristics are further improved by adding a passive cavity as in the case of this embodiment, and a new effect not found in the conventional laser is obtained.

This invention also includes embodiments possessing the philosophy of this invention other than mentioned above. Incidentally, the device has been described as using InP as the material of the compound semiconductor, but the invention is not so limited and AlGaAs, AlGaInP or other materials may be used.

Figure 18:
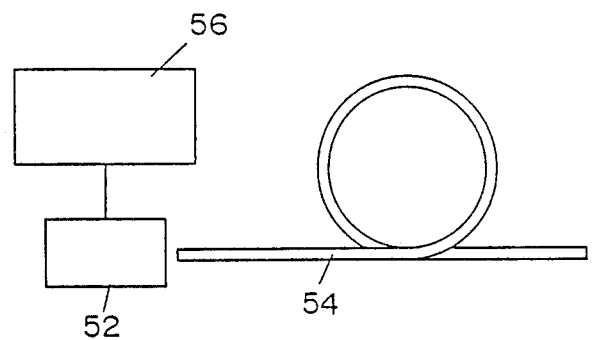
FIG. 18 and FIG. 19 are schematic illustrations showing a light signal transmission system using a semiconductor laser according to this invention.

Other embodiments are shown below as examples of the application of this invention. As shown in FIG. 18, a semiconductor laser 82 of this invention is coupled with an optical fiber 84 to obtain an optical transmission source. At this time, the driving current of semiconductor laser 82 is modulated by an analog signal from a modulator 86, and a multimode fiber is used as the optical fiber. As mentioned earlier, the intensity of noise does not increase by the reflected light from the optical fiber. Or, as stated above, wavelength chirping due to driving current modulation is extremely small. In an ordinary semiconductor laser, since wavelength chirping is great, the spatial propagation mode of the fiber is modulated to give rise to a change of the speckle pattern, which results in degrading of the quality of the transmission signal. By contrast, in the optical signal transmission apparatus using the semiconductor lasers of this invention, the quality of the transmission signal is extremely excellent, which is an outstanding feature not found in the conventional products.

Figure 19:
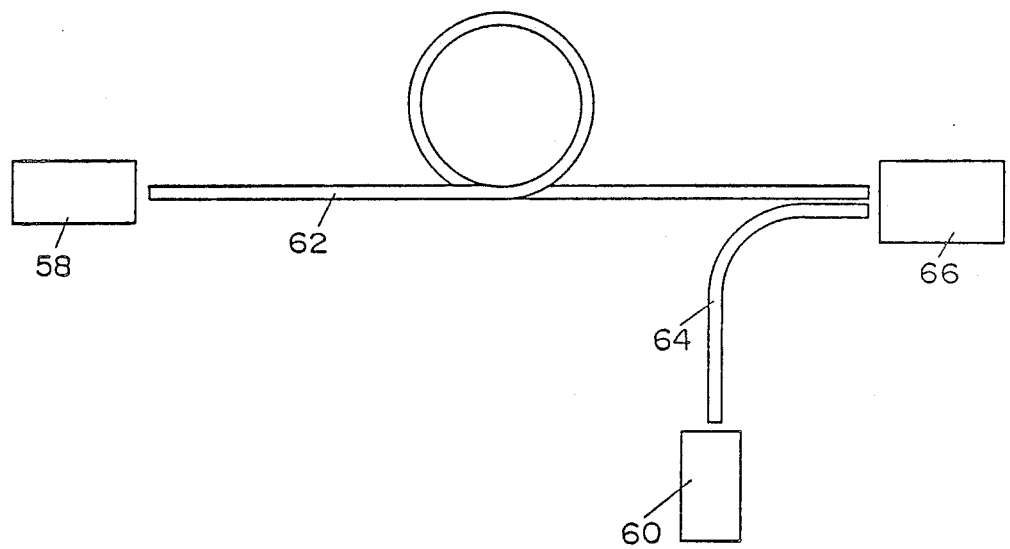

A different embodiment as another example of the application of the invention is shown in FIG. 19, in which the semiconductor laser of this invention is used as a light source for coherent light transmission. Both local oscillator source 94 and modulation signal source 88 are semiconductor lasers of this invention, which are respectively coupled with optical fibers 92, 90, and are subjected to heterodyne detection by a detector 96. Since the spectral linewidth of the semiconductor laser of this invention is narrow as mentioned above, it is extremely effective as a local oscillator source 94. Moreover, since frequency modulation, that is wavelength of chirping is possible in a signal source 88 for frequency modulation, it is also effective in this respect, and an unconventional optical signal transmission apparatus may be presented.

A further embodiment of a different application is an optical signal transmission apparatus for current modulation of the semiconductor laser of this invention at a modulation frequency of $c/2L_0$ (c: the velocity of light). There is known a technique called active mode locking, in which a cavity is attached to the outside of an ordinary semiconductor laser and it is modulated by its round trip frequency. It is intended to convert the longitudinal mode into multimodes and to generate picosecond pulses trains. In the present invention, however, if modulated at a frequency of $c/2L_0$ in particular, a light pulse transmission system with a stable single longitudinal mode, less wavelength chirping and low noise can be provided. This is completely different from active mode locking.

A still further embodiment if an application of this invention is an optical information processing unit using semiconductor lasers of this invention, such as an optical disc. Above all, extremely excellent characteristics can be prevented without deteriorating the S/N ratio of the system by the reflected light from the disc surface or surfaces of optical components. Or, as shown in FIG. 4, the oscillation wavelength can be varied by changing the driving current in the semiconductor laser of this invention. In the existing optical disc units, different lasers are used in recording, reproduction and erasing of information. This is because the oscillation wavelength and output power must be varied over each laser. In this invention, by contrast, the oscillation wavelength need be varied over a wide range only in one laser. In trial products of this invention, it was possible to control within a mode distance of up to 240 Å. For this purpose, of course, compounds having a gain at short wavelength such as AlGaAs and AlGaInP must be used as semiconductor materials. Anyway, plural functions may be possessed by one semiconductor laser. Or multiple functions may be achieved also by array arrangement of semiconductor lasers. This results in an optical information processing unit not possible before. While specific embodiments of the invention have been illustrated and described herein, it is to be understood that other modifications and changes will occur to those skilled in the art. It is therefore to be understood that the appended claims are intended to cover all modifications and changes as fall within the true spirit and scope of the invention.

What is claimed is:

1. An optical signal transmission apparatus comprising:
   a. a laser device including,
   a semiconductor substrate,
   an active cavity formed on said semiconductor substrate; and
   a passive cavity formed on said semiconductor substrate, said active and passive cavities being integrally formed on said semiconductor substrate with monolithic structure and coupled in the direction of optical axes of said cavities,
   said active cavity including,
   an active layer for emitting light therefrom,
   clad layers for confining said light into said active layer, and
   electrodes for injecting current into said active layer,
   said passive cavity including,
   a waveguide layer for transferring therethrough the light emitted in said active cavity, and
   clad layers for confining said light to said waveguide layer,
   said active and passive cavities having rectangular waveguide structure to confine said light in a plane perpendicular to said direction of optical axes of said cavities,
   resonator means for laser oscillation of said semiconductor laser device, the ratio $L_0/L_1$ of optical length $L_0$ of said passive cavity to optical length L of said active cavity being set in a range of $L_0/L_1 \geqq 0.5$, b. an optical fiber coupled to said laser device, said optical fiber comprising an optical transmission source, wherein the light emitted in said active cavity is transferred through said passive cavity and reflected and fed back to said active cavity such that the laser device comprises an optical transmission source and means for achieving analog modulation of a drive circuit.

2. An optical signal transmission apparatus comprising:

a. a laser device including,
a semiconductor substrate;
an active cavity formed on said semiconductor substrate; and
a passive cavity formed on said semiconductor substrate, said active and passive cavities being integrally formed on said semiconductor substrate with monolithic structure and coupled in the direction of optical axes of said cavities,
said active cavity including,
an active layer for emitting light therefrom,
clad layers for confining said light into said active layer, and
electrodes for injecting current into said active layer,
said passive cavity including,
a waveguide layer for transferring therethrough the light emitted in said active cavity, and
clad layers for confining said light to said waveguide layer,
said active and passive cavities having rectangular waveguide structure to confine said light in a plane perpendicular to said direction of optical axes of said cavities,
resonator means for laser oscillation of said semiconductor laser device,
the ratio $L_0/L_1$ of optical length $L_0$ of said passive cavity to optical length $L_1$ of said active cavity being set in a range of $L_0/L_1 \geqq 0.5$, b. an optical fiber coupled to said laser device,
wherein the light emitted in said active cavity is transferred through said passive cavity and reflected and fed back to said active cavity such that the laser device comprises an optical transmission source and forms a local oscillator source and a source of coherent light transmission.

3. An optical signal transmission apparatus comprising:

a. a laser device including,
a semiconductor substrate;
an active cavity formed on said semiconductor substrate; and
a passive cavity formed on said semiconductor substrate, said active and passive cavities being integrally formed on said semiconductor substrate with monolithic structure and coupled in the direction of optical axes of said cavities,
said active cavity including,
an active layer for emitting light therefrom,
clad layers for confining said light into said active layer, and
electrodes for injecting current into said active layer,
said passive cavity including,
a waveguide layer for transferring therethrough the light emitted in said active cavity, and
clad layers for confining said light to said waveguide layer,
said active and passive cavities having rectangular waveguide structure to confine said light in a plane perpendicular to said direction of optical axes of said cavities,
resonator means for laser oscillation of said semiconductor laser device,
the ratio $L_0/L_1$ of optical length $L_0$ of said passive cavity to optical length $L_1$ of said active cavity being set in a range of $L_0/L_1 \geqq 0.5$, b. means for modulating current at a modulation frequency of $c/2L_1$, wherein c is equal to the speed of light, said current modulating means being coupled to said laser device,
wherein the light emitted in said active cavity is transferred through said passive cavity and reflected and fed back to said active cavity.

4. An optical information processing apparatus comprising:

a. a laser device including,
a semiconductor substrate;
an active cavity formed on said semiconductor substrate; and
a passive cavity formed on said semiconductor substrate, said active and passive cavities being integrally formed on said semiconductor substrate with monolithic structure and coupled in the direction of optical axes of said cavities,
said active cavity including,
an active layer for emitting light therefrom,
clad layers for confining said light into said active layer, and
electrodes for injecting current into said active layer,
said passive cavity including,
a waveguide layer for transferring therethrough the light emitted in said active cavity, and
clad layers for confining said light to said waveguide layer,
said active and passive cavities having rectangular waveguide structure to confine said light in a plane perpendicular to said direction of optical axes of said cavities,
resonator means for laser oscillation of said semiconductor laser device,
the ratio $L_0/L_1$ of optical length $L_0$ of said passive cavity to optical length $L_1$ of said active cavity being set in a range of $L_0/L_1 \geqq 0.5$, b. a component of an optical information processing system such as an optical disk coupled to the laser device,
wherein the light emitted in said active cavity is transferred through said passive cavity and reflected and fed back to said active cavity.

* * * * *